(12) United States Patent
     Mao

(10) Patent No.: US 11,694,880 B2
(45) Date of Patent: Jul. 4, 2023

(54) LIFT THIMBLE SYSTEM, REACTION CHAMBER, AND SEMICONDUCTOR PROCESSING EQUIPMENT

(71) Applicant: BEIJING NAURA MICROELECTRONICS EQUIPMENT CO., LTD., Beijing (CN)

(72) Inventor: Xingfei Mao, Beijing (CN)

(73) Assignee: BEIJING NAURA MICROELECTRONICS EQUIPMENT CO., LTD, Beijing (CN)

( * ) Notice: Subject to any disclaimer, the term of this patent is extended or adjusted under 35 U.S.C. 154(b) by 30 days.

(21) Appl. No.: 17/263,078

(22) PCT Filed: Jul. 30, 2019

(86) PCT No.: PCT/CN2019/098370
     § 371 (c)(1),
     (2) Date: Jan. 25, 2021

(87) PCT Pub. No.: WO2020/029833
     PCT Pub. Date: Feb. 13, 2020

(65) Prior Publication Data
     US 2021/0313157 A1    Oct. 7, 2021

(30) Foreign Application Priority Data
     Aug. 10, 2018  (CN) .................. 201810911227.X

(51) Int. Cl.
     *H01J 37/32*    (2006.01)
     *H01L 21/683*   (2006.01)
     *H01L 21/687*   (2006.01)

(52) U.S. Cl.
     CPC .. *H01J 37/32715* (2013.01); *H01J 37/32642* (2013.01); *H01L 21/6833* (2013.01);
     (Continued)

(58) Field of Classification Search
     CPC ....... H01J 2237/20235; H01J 2237/334; H01J 37/32715; H01J 37/32642; H01L 21/6833; H01L 21/68721; H01L 21/68742
     (Continued)

(56) References Cited

U.S. PATENT DOCUMENTS

| | | | | |
|---|---|---|---|---|
| 3,625,442 A * | 12/1971 | DiMeglio | ............ | B65H 67/052 242/474.4 |
| 3,915,398 A * | 10/1975 | Corl | ...................... | B65H 67/04 242/473.7 |
| 5,351,576 A * | 10/1994 | Matsui | ...................... | F16C 3/22 100/282 |
| 5,569,350 A | 10/1996 | Osada et al. | | |

(Continued)

FOREIGN PATENT DOCUMENTS

| CN | 101640181 A | 2/2010 |
|---|---|---|
| CN | 101899715 A | 12/2010 |

(Continued)

OTHER PUBLICATIONS

World Intellectual Property Organization (WIPO) International Search Report for PCT/CN2019/098370 dated Oct. 28, 2019 6 Pages (including translation).

*Primary Examiner* — Charlee J. C. Bennett
(74) *Attorney, Agent, or Firm* — Anova Law Group, PLLC

(57) ABSTRACT

The present disclosure discloses a lift thimble system, a reaction chamber, and semiconductor processing equipment, including a wafer thimble device configured to lift a wafer from a base by rising or drop the wafer onto the base by descending, and a focus ring thimble device configured to lift a focus ring from an initial position of the focus ring by rising to cause an inner ring area of an upper surface of the (Continued)

focus ring to lift an edge area of the wafer, or cause the focus ring to return to the initial position by descending. The technical solutions of the system, the reaction chamber, and the equipment of the present disclosure improve maintenance efficiency of an abnormal situation, and double the service lifetime of the focus ring. Moreover, the technical solutions may further realize replacement of the focus ring without damaging reaction chamber vacuum to improve efficiency.

12 Claims, 6 Drawing Sheets

(52) U.S. Cl.
CPC .. *H01L 21/68721* (2013.01); *H01L 21/68742* (2013.01); *H01J 2237/20235* (2013.01); *H01J 2237/334* (2013.01)

(58) Field of Classification Search
USPC ...................................................... 156/345.24
See application file for complete search history.

(56) References Cited

U.S. PATENT DOCUMENTS

| | | | | |
|---|---|---|---|---|
| 5,838,528 | A * | 11/1998 | Os | H02N 13/00 279/128 |
| 6,044,534 | A | 4/2000 | Seo et al. | |
| 6,305,677 | B1 * | 10/2001 | Lenz | H01L 21/6831 269/21 |
| 8,142,611 | B2 * | 3/2012 | Shibata | H01L 21/6836 156/247 |
| 2012/0247671 | A1 * | 10/2012 | Sugawara | H01L 21/68742 156/345.31 |

FOREIGN PATENT DOCUMENTS

| | | |
|---|---|---|
| CN | 101944498 A | 1/2011 |
| CN | 104576491 A | 4/2015 |
| CN | 105655279 A | 6/2016 |
| CN | 109192696 A | 1/2019 |
| JP | H07305168 A | 11/1995 |
| JP | H09162258 A | 6/1997 |
| JP | 2016046451 A | 4/2016 |
| JP | 2018006374 A | 1/2018 |
| TW | 200624360 A | 7/2006 |
| TW | 201622057 A | 6/2016 |
| WO | 2017131927 A1 | 8/2017 |

* cited by examiner

LIFT THIMBLE SYSTEM, REACTION CHAMBER, AND SEMICONDUCTOR PROCESSING EQUIPMENT

CROSS-REFERENCES TO RELATED APPLICATIONS

This application is a national phase entry under 35 U.S.C. § 371 of International Application No. PCT/CN2019/098370, filed on Jul. 30, 2019, which claims priority to Chinese Application No. 201810911227.X filed Aug. 10, 2018, the entire contents of both of which are incorporated herein by reference.

TECHNICAL FIELD

The present disclosure generally relates to the semiconductor integrated manufacturing technology field and, more particularly, to a lift thimble system, a reaction chamber, and semiconductor processing equipment.

BACKGROUND

To ensure that a reaction chamber of a plasma etching machine operates in a vacuum state, one transfer platform is usually connected to two to four reaction chambers of the etching machine. Moreover, a manipulator of the transfer platform is configured to transfer a wafer from an atmospheric end to the reaction chamber of the etching machine. After placing the wafer on a height-adjustable thimble mechanism, the manipulator is removed. Then, the wafer is dropped to an electrostatic chuck by lowering the height-adjustable thimble. The wafer is adsorbed on the electrostatic chuck during the process. After the wafer processing is completed, the electrostatic chuck loses power, and the height-adjustable thimble mechanism rises to lift the wafer to a set height, and then the manipulator enters the reaction chamber to transfer the wafer out, so as to complete the wafer transfer process.

However, after a plurality of etching operations, even though the electrostatic chuck is in a power-off state, residual static electricity may not be eliminated, and load distribution is uneven. As a result, when the height-adjustable thimble mechanism lifts the wafer, a position deviation may occur due to wafer movement. The wafer may even tilt and misalign due to adhesion between the wafer and the electrostatic chuck, which causes the manipulator not be able to transfer the wafer and the operator having to stop and open the reaction chamber, to fetch the wafer manually. Therefore, wafer scrap risk and maintenance cost are increased.

SUMMARY

Embodiments of the present disclosure provide a lift thimble system, a reaction chamber, and semiconductor processing equipment.

According to an aspect of embodiments of the present disclosure, the present disclosure provides a lift thimble system, including a wafer thimble device configured to lift a wafer from a base by rising or drop the wafer onto the base by descending, and further including a focus ring thimble device configured to lift a focus ring from an initial position of the focus ring by rising to cause an inner ring area of an upper surface of the focus ring to lift an edge area of the wafer or cause the focus ring to return to the initial position by descending.

In some embodiments, the focus ring thimble device includes at least three focus ring thimbles and a first lift drive device. At least three first through-holes are arranged in the base and vertically below the focus ring and at intervals along a circumferential direction of the focus ring. The first lift drive device is configured to drive the at least three focus ring thimbles to rise or descend and pass through the at least three through-holes in a one-by-one correspondence.

In some embodiments, the first lift drive device includes a drive bracket and a first drive unit. A lower end of each focus ring thimble is connected to the drive bracket. The first drive unit is fixed at a bottom of the base. A drive shaft of the first drive unit is connected to the drive bracket and is configured to drive the drive bracket and the focus ring thimbles to rise and descend synchronously.

In some embodiments, the focus ring thimble device further includes at least three first bellows. Each of the at least three first bellows is correspondingly sleeved at each of the focus ring thimbles. An upper end of each of the at least three first bellows is sealed by and connected to the bottom of the base. A lower end of each of the at least three first bellows is sealed by and connected to each of the at least three focus ring thimbles or the drive bracket to seal a gap between each of the at least three focus ring thimbles and each of the at least three first through-holes.

In some embodiments, the first drive unit includes an electric cylinder, a servo motor, and a control device. A cylinder body of the electric cylinder is fixedly connected to the base. A movable end of the electric cylinder is fixedly connected to the drive bracket. The control device is electrically connected to the servo motor. The servo motor is connected to an input terminal of the electric cylinder and controls the movable end of the electric cylinder to extend and retract according to a control signal transmitted by the control device.

In some embodiments, the first drive unit includes a linear cylinder and a height-adjustment device. A movable end of the linear cylinder is fixedly connected to the drive bracket and is configured to drive the drive bracket and the at least three focus ring thimbles to rise and descend synchronously. The height-adjustment device is fixedly connected to the base, is connected to a cylinder body of the linear cylinder, and is configured to adjust a height of the cylinder body of the linear cylinder.

In some embodiments, the height-adjustment device includes a crank mechanism and a swing cylinder. The crank mechanism is swingable and is fixedly connected to the base, a swing lever of the crank mechanism being connected to the cylinder body of the linear cylinder. The swing cylinder is connected to the swing lever of the crank mechanism and is configured to drive the swing lever to swing eccentrically to drive the cylinder body of the linear cylinder to rise and descend.

In some embodiments, the height-adjustment device further includes a throttle valve, a flow meter, and a control unit. The flow meter is configured to detect an actual airflow of the swing cylinder and transmit the actual airflow to the control unit. The control unit is configured to control the throttle valve to adjust the airflow of the swing cylinder according to the actual airflow to control a swing angle of the swing cylinder.

In some embodiments, the wafer thimble device includes at least three wafer thimbles and a second lift drive device. At least three second through-holes are arranged vertically in the base and at intervals along a circumferential direction of the base. The second lift drive device is configured to drive the at least three wafer thimbles to rise and descend and passes through the at least three second through-holes in a one-by-one correspondence.

In some embodiments, the second lift drive device includes at least three second drive units. Each of the at least second drive units is configured to drive correspondingly each of the at least three wafer thimbles to rise and descend. Each of the at least three second drive units includes a cylinder, a barrel, and a second bellow. An upper end of the barrel is fixedly connected to the base, and a lower end of the cylinder is fixedly connected to a cylinder body of the cylinder. A movable end of the cylinder is fixedly connected to a lower end of each of the at least three wafer thimbles and is configured to drive each of the at least three thimbles to rise and descend. The second bellows is arranged in the barrel and sleeved at each of the at least three thimbles. An upper end of the second bellows is sealed by and connected to the bottom end of the base, and a lower end of the second bellows is sealed by and connected to each of the at least three wafer thimbles to seal a gap between each of the at least three wafer thimbles and each of the at least three second through-holes.

In some embodiments, the base includes an electrostatic chuck.

According to another aspect of the present disclosure, the present disclosure provides a reaction chamber, including a base and a focus ring arranged at the base. The base includes a load surface configured to carry a center area of a wafer. An inner ring area of an upper surface of the focus ring is opposite to a ring-shaped edge area of the wafer arranged at the load surface. The reaction chamber further includes a lift thimble system provided by the present disclosure.

According to another aspect of the present disclosure, the present disclosure provides semiconductor processing equipment, including a transfer platform and a reaction chamber connected to the transfer platform. A manipulator is arranged in the transfer platform. The reaction chamber includes the reaction chamber provided by the present disclosure.

In the technical solutions of the lift thimble system, the reaction chamber, and the semiconductor processing equipment provided by the above embodiments, the focus ring thimble device is added to lift the focus ring from the initial position by ascending or return the focus ring to the initial position by descending. When the wafer thimble device lifts the wafer from the base, if the wafer has the position deviation and tilts, the focus ring can be raised to lift the wafer up. Thus, without damaging the vacuum of the reaction chamber, the adhesion problem of the wafer and the base may be solved to ensure that the manipulator may successfully take out the wafer. As such, the maintenance efficiency of the abnormal condition may be improved, and the risk of wafer scrap and maintenance cost may be reduced. In addition, the focus ring thimble device may be configured to precisely raise the height of the focus ring after the predetermined time, which may cause the service lifetime of the focus ring to be doubled. Moreover, the focus ring may be replaced without damaging the reaction vacuum to improve the efficiency of replacing consumable parts.

Additional aspects and advantages of embodiments of the present disclosure are partially given in the following description. These aspects and advantages become obvious from the following description or are understood through the practice of the present disclosure.

BRIEF DESCRIPTION OF THE DRAWINGS

To describe the present disclosure or the technical solution of the existing technology clearer, the accompanying drawings that are needed for the description of embodiments of the existing technology are described. Apparently, the accompanying drawings described below show merely some embodiments of the present disclosure. For those of ordinary skill in the art, other drawings may be obtained according to these drawings without creative efforts.

FIG. 2A is a front view, FIG. 2B is a top view.

FIG. 6A is a front view, FIG. 6B is a side view, and FIG. 6C is a top view.

FIG. 7A is a front view, and FIG. 7B is a top view.

DETAILED DESCRIPTION OF THE EMBODIMENTS

The present disclosure is described more thoroughly below with reference to the accompanying drawings to describe exemplary embodiments of the present disclosure. The technical solutions of the present disclosure are described clearly and entirely in connection with the accompanying drawings of embodiments of the present disclosure. Obviously, described embodiments are merely some embodiments of the present disclosure, but not all embodiments. Based on embodiments of the present disclosure, all other embodiments obtained by those of ordinary skill in the art without any creative effort are within the scope of the present disclosure. The technical solutions of embodiments of the present disclosure are described in various aspects below in connection with accompanying drawings.

To facilitate the description, directions of "left," "right," "up," and "down" described in the specification are consistent with directions of left, right, up, and down in the accompanying drawings. "first" and "second" in the specification are only used to describe the difference, and do not have other special meanings.

Figure 1:
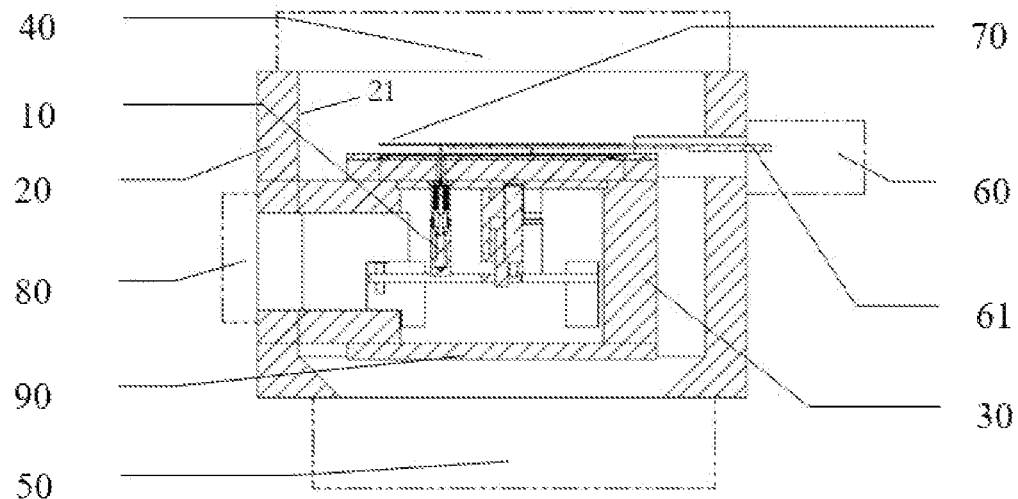
FIG. 1 is a schematic cross-section diagram of a reaction chamber according to some embodiments of the present disclosure.

As shown in FIG. 1, the present disclosure provides a lift thimble system 10 which is mounted inside a reaction chamber 20. An upper electrode 40 is arranged at a top of the reaction chamber, and a vent opening configured to be connected to a vacuum system 50 for vacuuming is arranged at a bottom of the reaction chamber 20 to provide a vacuum environment inside the reaction chamber. The reaction chamber 20 is connected to a vacuum transfer system 60 (e.g., a transfer platform). A wafer transfer opening configured for a vacuum manipulator 61 to enter and exit is arranged on a sidewall of the reaction chamber 20. A wafer 70 is transferred by the vacuum manipulator 61. In addition, a sidewall 21 of the reaction chamber 20 opposite to the wafer transfer opening may be sealed by and connected to a base 30. A channel 80 is arranged at the sidewall 21 and configured to introduce devices, such as a cable, clean dry air (CDA), and a cooling liquid pipe required by the lift thimble system 10. In addition, an upper part of the base 30 is sealed by the lift thimble system 10, and the lower part is sealed by a cover plate 90.

In some embodiments, the base 30 includes an electrostatic chuck. The electrostatic chuck includes a chuck body and an interface plate arranged at the bottom of the chuck. A focus ring is arranged at the base 30. An initial position of the focus ring, that is, the position during the process is: surround a load surface of the base 30 configured to carry a central area of the wafer 70. An inner area of the upper surface of the focus ring is opposite to a ring-shaped edge area of the wafer 70. The inner area refers to the ring-shaped area on the upper surface of the focus ring close to the inner ring edge of the upper surface. It is easy to understand that the center area formed by the ring-shaped area and the above-mentioned load surface is an area equivalent to the shape and size of the wafer 70. The focus ring is configured to limit the plasma during the process. Of course, in practical applications, the base 30 may also have another structure.

Figure 2A:
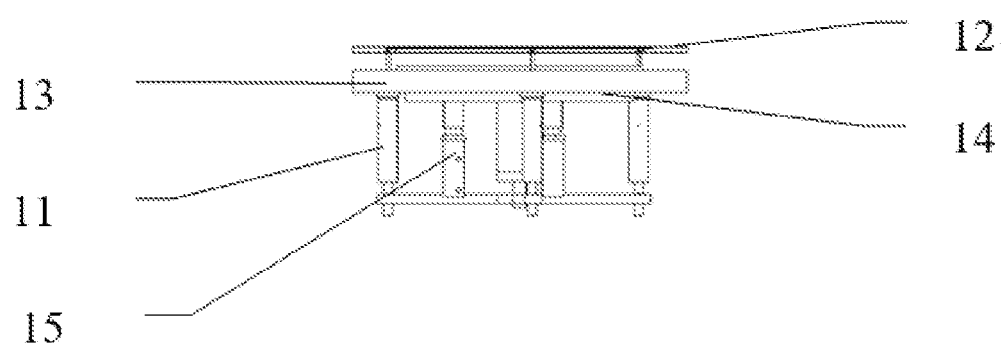
FIG. 2A and FIG. 2B are schematic assembly diagrams of a height-adjustable thimble mechanism according to some embodiments of the present disclosure, where
Figure 2B:
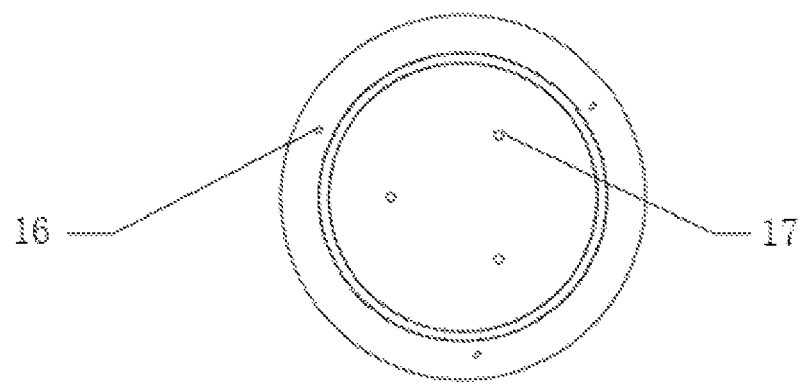

In some embodiments, as shown in FIG. 2A and FIG. 2B, the lift thimble system 10 includes a focus ring thimble device 11 and a wafer thimble device 15. The focus thimble device 11 is configured to rise to lift a focus ring 12 from the initial position or descend to return the focus ring 12 to the initial position.

By adding the focus thimble device 11, the top focus thimble device 11 may rise to lift the focus ring 12 from the initial position or descend to cause the focus ring 12 to return to the initial position. As such, when the wafer is lifted by the wafer thimble device 15 from the chuck body 13, if the wafer has position deviation or tilts, the focus ring thimble device 11 may lift the focus ring 12. The inner ring area of the top surface of the focus ring 12 may lift the edge area of the wafer to cause the wafer to rise and be separated from the chuck body 13. Since the focus ring 12 includes a ring body, a contact surface between the focus ring 12 and the wafer 70 is in a circular ring shape. The contact area is large, and the wafer is uniformly stressed. Thus, the wafer 70 may be prevented from jumping due to uneven residual electrostatic absorption. Moreover, the problem of the adhesion of the wafer and the base may be solved without damaging the vacuum of the reaction chamber, which may ensure that the manipulator takes out the wafer successfully. Thereby, maintenance efficiency of an abnormal condition may be improved, and the risk of wafer scrap and maintenance cost may be reduced. In addition, by using the focus ring thimble device 11 to accurately raise the height of the focus ring 12 after a predetermined process time, the service life of the focus ring 12 may be doubled, and the focus ring may be replaced without damaging the vacuum of the reaction chamber. Thus, the efficiency of replacing a consumable part may be improved.

After the focus ring 12 lifts the wafer, the wafer thimble device 15 may rise to lift the wafer, or descend to drop the wafer onto the wafer thimble device 15. Then, the wafer thimble device 15 is configured to perform a conventional lifting operation to cooperate with the manipulator to complete a wafer fetching operation. Of course, in practical applications, the focus ring 12 may also be directly lifted from the initial position by rising the focus ring thimble device 11. The focus ring 12 first may lift the wafer to the wafer transfer position, and then the wafer thimble device 15 may rise to the wafer transfer position to complete the transfer of the wafer. Then, the wafer thimble device 15 may cooperate with the manipulator to complete the wafer fetching operation. Therefore, the focus ring thimble device 11 may not only correct the position deviation or tilt of the wafer when transferring, but also can directly participate in the transferring process, which may fundamentally prevent the wafer from having the position deviation or tilt. In addition, the focus ring thimble device 11 may lift the height of the focus ring 12 to replace the focus ring 12 or adjust the height of the focus ring 12.

Figure 3:
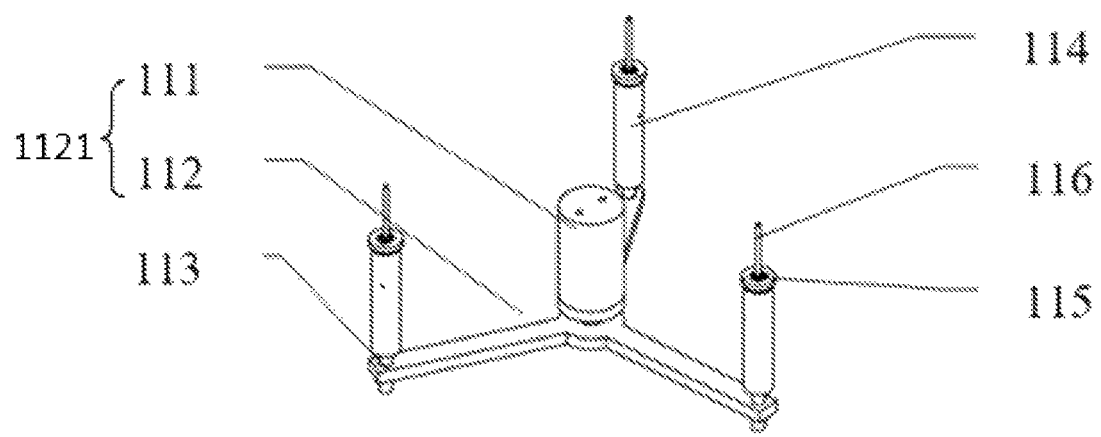
FIG. 3 is a schematic structural diagram of a focus ring thimble device according to some embodiments of the present disclosure.

In embodiments of the present disclosure, as shown in FIG. 2A to FIG. 3, the focus ring thimble device 11 includes at least three focus ring thimbles 116 and a first lift drive device. As shown in FIG. 2, in the chuck body 13, at least three first through holes 16 are arranged vertically below the focus ring 12, and the at least three first through holes 16 are arranged at intervals along the circumferential direction of the focus ring 12. The first lift drive device is configured to drive the at least three focus ring thimbles 116 to rise or descend, and pass through the at least three first through holes 16 one by one. Thus, the first lift drive device may lift the focus ring 12 from the chuck body 13 or drop the focus ring 12 onto the chuck body 13.

In an embodiment, the first lift drive device may include a plurality of implementations. For example, as shown in FIG. 3, the first lift drive device 1121 includes a drive bracket 112 and a first drive unit 111. A lower end of each focus ring thimble 116 is connected to the drive bracket 112. The first drive unit 11 may be fixed at the bottom of the interface plate 14. A drive shaft of the first drive unit 111 is connected to the drive bracket 112 and is configured to drive the drive bracket 112 and the focus ring thimbles 116 to rise or descend synchronously.

In an embodiment, the focus ring thimble device 11 further includes at least three first bellows 114. Each first bellows 114 is correspondingly sleeved on one of the focus ring thimbles 116. An upper end of each first bellows 114 may be sealed by and connected to the interface plate 14. For example, the first bellows 114 is sealed by the interface plate 14 using an O ring 115. A lower end of each first bellows 14 may be sealed by and connected to the focus ring thimble 116 and is configured to seal a gap between the focus ring thimble 116 and the first through-hole 16. Thus, sealing performance inside the base 30 may be ensured.

In some embodiments, the focus ring thimble 116 and the drive bracket 112 may be connected through an adjustment mechanism 113. The adjustment mechanism 113 may include a plurality of implementations and may be configured to adjust the height of the focus ring thimble 116. For example, the adjustment mechanism 113 may include an adjustable screw. A threaded through-hole may be vertically arranged at the drive bracket 112. The adjustable screw may be fixedly connected to the lower end of the focus ring thimble 116, arranged through the threaded through-hole, and cooperate with the threaded through-hole in a threaded connection. During adjustment, the height of the focus ring thimble 116 may be adjusted by loosening or tightening the adjustment screw.

When driven by the first drive unit 111, the drive bracket 112 and the focus ring thimble 116 may rise and descend synchronously. Specifically, when the drive shaft of the first drive unit 111 extends downward, the drive bracket 112 and the focus ring thimble 116 may descend, and the first bellows 114 may extend simultaneously. When the drive shaft of the first drive unit 111 retracts upwards, the drive bracket 112 and the focus ring thimble 116 may rise, and the first bellows 114 may retract simultaneously. The first drive unit 111 may use a cylinder or an electric cylinder as a power source.

Figure 4:
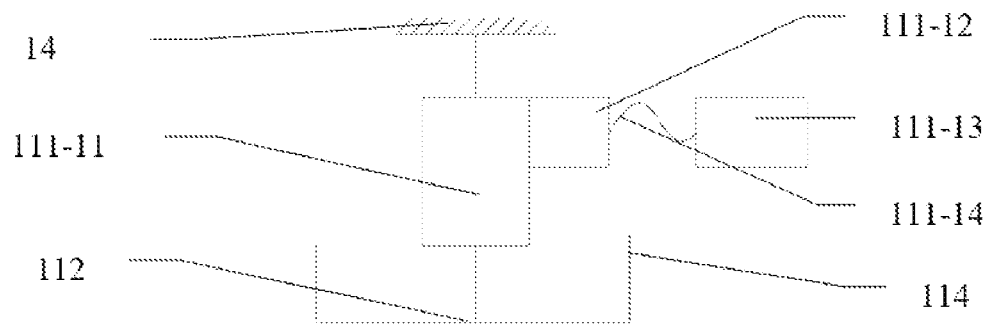
FIG. 4 is a schematic drive principle diagram of a first drive unit according to some embodiments of the present disclosure.

In an embodiment, as shown in FIG. 4, the first drive unit includes an electric cylinder 111-11, a servo motor 111-12, and a control device 111-13. The cylinder body of the electric cylinder 111-11 may be a fixed end and configured as a mounting base. The cylinder body of the electric cylinder 111-11 is fixedly connected with the interface plate 14, and a movable end of the electric cylinder 111-11 is fixedly connected to the drive bracket 112. A control device 111-13 is electronically connected to the servo motor 111-12 via a control conductive cable 111-14, and the servo motor 111-12 is connected to an input terminal of the electric cylinder 111-11. The servo motor 111-12 may be configured to control the movable end of the electric cylinder 111-11 to extend or retract according to the control signal transmitted by the control device 111-13. In practical applications, a rotation motion of the servo motor 111-12 may be converted into a linear motion through a transmission mechanism such as a screw, which may be transmitted to the movable end of the electric cylinder 111-11 to extend or retract.

Figure 5:
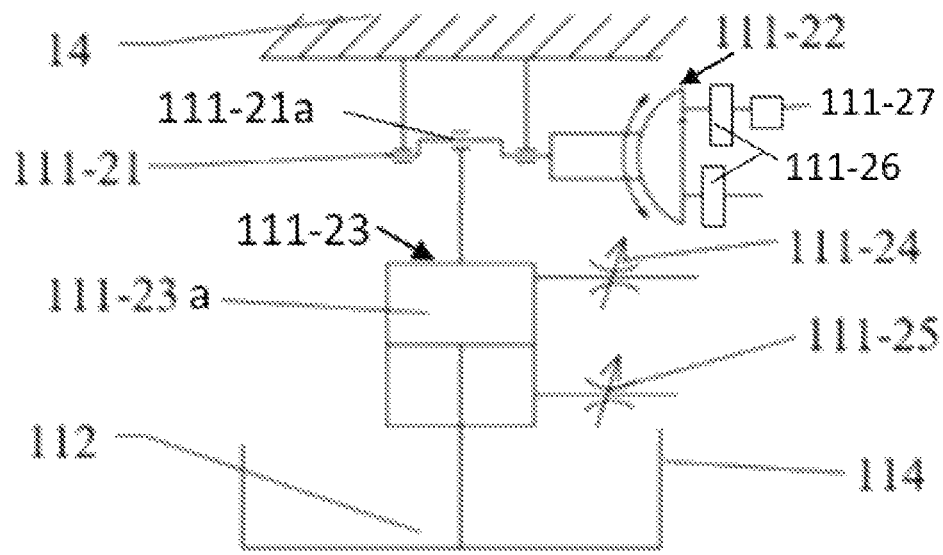
FIG. 5 is another drive principle diagram of the first drive unit according to some embodiments of the present disclosure.

Of course, in practical applications, the first drive unit may also include another mechanism, for example, as shown in FIG. 5, the first drive unit includes a linear cylinder 111-23 and a height-adjustment device. The movable end of the linear cylinder 111-23 is fixedly connected to the drive bracket 112 and may be configured to drive the drive bracket 112 and the focus ring thimble 116 to move up and down synchronously. The height adjustment device is fixedly connected to the interface plate 14 and the cylinder body 111-23a of the linear cylinder 111-23 to adjust the height of the cylinder body 111-23a of the linear cylinder 111-23.

With the aid of the above-mentioned height-adjustment device, the mechanism of the linear cylinder 111-23 and the drive bracket 112 may be lifted as a whole, and meanwhile, the height of the focus ring 12 may be precisely controlled. As such, when the focus ring 12 is etched to a certain etching amount, the focus ring 12 may be lifted to make the height change be equivalent to the etching amount of the focus ring 12. Thus, the focus ring 12 may be used continuously. Thereby, the service life of focus ring 12 may be extended. In practical applications, a maximum value of the process height change of the focus ring 12 may be usually less than or equal to 1 mm. Through this adjustment, the service cycle of the focus ring 12 may be extended to two process cycles (the existing technology generally needs to replace the focus ring 12 after a process cycle). When the focus ring 12 needs to be replaced, the linear cylinder 111-23 may be configured to drive the focus ring 12 to rise and descend.

Specifically, the above-mentioned height-adjustment device may have a plurality of implementations. For example, as shown in FIG. 5, the height-adjustment device includes a crank mechanism 111-21 and a swing cylinder 111-22. The crank mechanism 111-21 may include an eccentric rotation mechanism such as a crank connection lever mechanism, and the crank mechanism 111-21 may be swingable and fixedly connected to the interface plate 14. The swing lever of the crank mechanism 111-21 is connected to the cylinder body of the linear cylinder 111-23. The cylinder body of linear cylinder 111-23 may include a fixed end, which may be configured as a mounting base. The movable end of the linear cylinder 111-23 is fixedly connected to the drive bracket 112. The swing cylinder 111-22 is connected to the swing lever of the crank mechanism 111-21 to drive the swing lever of the crank mechanism 111-21 to swing eccentrically to drive the cylinder body of the linear cylinder 111-23 to rise and descend.

When the first drive unit is driven by the cylinder, the linear cylinder 111-23 may be used as a power source for lifting and lowering the focus ring 12. The crank mechanism 111-21 is connected to the cylinder body of the linear cylinder 111-23. The swing cylinder 111-22 may be configured to drive the crank mechanism 111-21 to push the linear cylinder 111-23 and the drive bracket 112 as a whole to rise and descend. An eccentric value of the crank mechanism 111-21 may be equal to the maximum value of the focus ring process height adjustment. That is, after the focus ring 12 reaches the process time for the first time, the swing cylinder 111-22 may be configured to push the crank mechanism 111-21 to eccentrically swing a predetermined angle to cause the mechanism including the linear cylinder 111-23 and the drive bracket 112 to be lifted as a whole until the height change is equivalent to the etching amount of the focus ring 12.

In some embodiments, the height-adjustment device also includes a throttle valve 111-26, a flow meter 111-27, and a control unit. The flow meter 111-27 may be configured to detect an actual airflow amount of the swing cylinder 111-22 and transmit the actual airflow amount to a control unit. The control unit may be configured to control the flow control throttle valve 111-26 to adjust the airflow amount of the swing cylinder 111-22 according to the actual airflow amount to control the swing angle of the swing cylinder 111-22. As such, the control unit may precisely control the swing angle of the swing cylinder 111-22. Therefore, the accuracy of adjusting the process height of the focus ring 12 may be improved, the consistency of the etching process may be effectively improved, and the service life of the focus ring 12 may be increased.

It needs to be noted that, the linear cylinder 111-23 and swing cylinder 111-22 may be connected to an air source through a control channel 111-25 and the throttle valve 111-24.

In an embodiment, as shown in FIG. 2B, FIG. 6A, FIG. 6B, and FIG. 6C, the wafer thimble device 15 includes at least three wafer thimbles 153 and a second lift drive device 610. At least three second through holes 17 may be vertically arranged in the chuck body 13, the at least three first through holes 17 may be arranged at intervals along the circumferential direction of the chuck body 13. The second lift drive device 610 may be configured to drive the at least wafer thimbles 153 to rise or descend and pass through the at least three second through holes 17 one by one. As such, the wafer thimbles 153 may lift the wafer from the chuck body 13 or drop the wafer onto the chuck body 13.

In an embodiment, the second lift drive device 610 may include at least three second drive units 616. Each second drive unit 616 may be configured to correspondingly drive one of the wafer thimbles 153 to rise and descend one by one. Of course, all the wafer thimbles 153 may move synchronously. In practical applications, the same drive unit may also be configured to drive the wafer thimbles 153 to rise and descend synchronously.

Figure 6A:
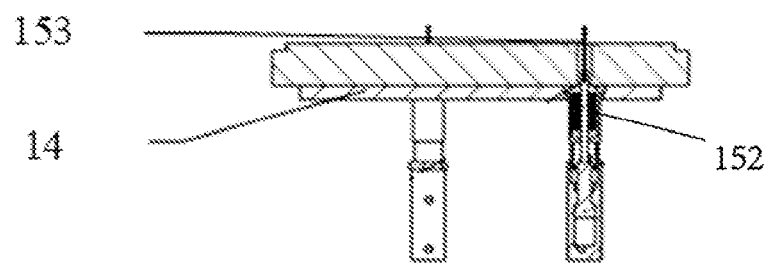
FIG. 6A, FIG. 6B, and FIG. 6C are schematic structural diagrams of a wafer thimble device according to some embodiments of the present disclosure, where
Figure 6B:
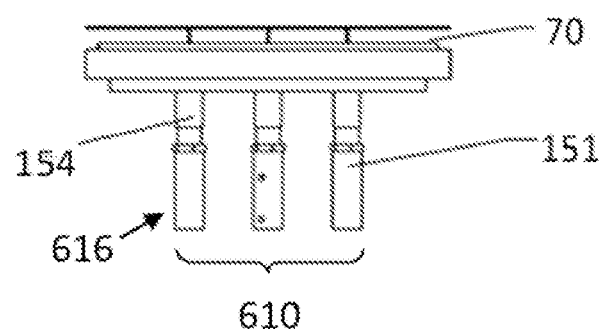
Figure 6C:
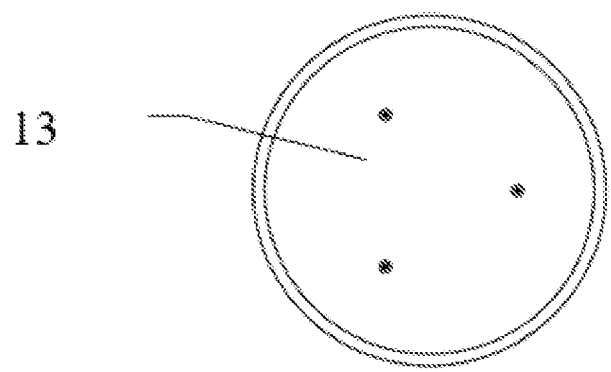

Each second drive unit 616 may have a plural of implementations. For example, as shown in FIGS. 6A, 6B, and 6C, each second drive unit 616 includes a cylinder 151, a mounting barrel 154, and a second bellow 152. The cylinder 151, the mounting barrel 154, and the second bellows 152 may form an integrated structure, which may simplify an equipment structure and reduce an occupied space. An upper end of the mounting barrel 154 is fixedly connected to the interface plate 14, and a lower end is fixedly connected to the cylinder body of the cylinder 151. A movable end of the cylinder 151 is fixedly connected to a lower end of the wafer thimble 153 to drive the wafer thimble 153 to rise and descend. The second bellow 152 is arranged in the mounting barrel 154 and sleeved on the wafer thimble 153. The upper end of the second bellows 152 is sealed by and connected to the interface plate 14, and the lower end is sealed by and connected to the wafer thimble 153 to seal a gap between the wafer thimble 153 and the second through-hole 17 to ensure the sealing performance inside the base.

Figure 7A:
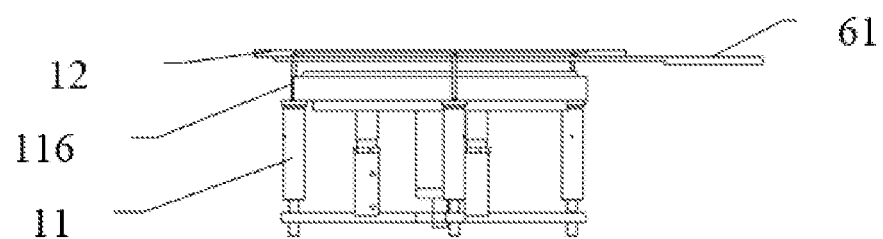
FIG. 7A and FIG. 7B are schematic diagrams of transferring the focus ring according to some embodiments of the present disclosure, where
Figure 7B:
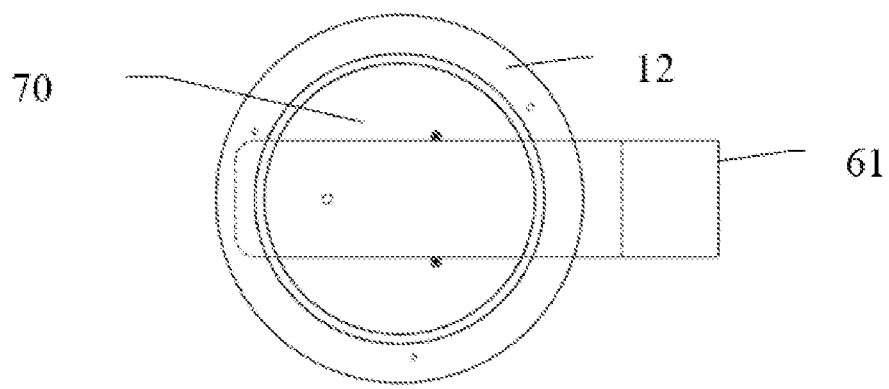

In addition, to eliminate negative consequences of the tilt and the position deviation of the wafter, the lift thimble system 10 provided by the present disclosure may also realize the replacement of the focus ring 12 without opening the reaction chamber 20. When the reaction chamber 20 does not reach a maintenance cycle, and the focus ring 12 reaches the replacement cycle first or needs to be replaced due to other reasons, the focus ring thimble device 11 may be configured to raise the focus ring 12 and open the wafer transfer opening of the reaction chamber 20 connected to the vacuum transfer system 60. Then, the vacuum manipulator 61 may be configured to enter the reaction chamber 20 and take out the focus ring 12. As shown in FIG. 7A and FIG. 7B, the vacuum manipulator 61 is configured to transfer a new focus ring 12 into the reaction chamber 20. After causing the focus ring thimble device 11 to rise and descend to transfer the new focus ring 12 onto the focus ring thimble device 11, the vacuum manipulator 61 may be removed. The focus ring thimble device 11 may descend until the focus ring 12 drops to the initial position of the chuck body 13. During the operation of replacing the focus ring 12, the wafer thimble 153 may be in a low position status, that is, the top of the wafer thimble 153 may be located below the chuck body 13 to avoid movement interference.

If a wafer 70 tilts or has a position deviation during the process of raising the wafer 70 by the wafer thimble device 15, and the vacuum manipulator 61 cannot fetch the wafer 70, the focus ring thimble device 11 may raise the focus ring 12, and then the vacuum manipulator 61 may carry the focus ring 12 and the wafer 70 to move out of the reaction chamber 20 together. During the process, the reaction chamber 20 does not need to be opened. Therefore, the maintenance efficiency of the abnormal condition may be improved. The above operation may not need to damage the vacuum environment of the etching machine, which may not only improve continuous process time of the etching machine, but also reduce corrosion of the process air channel caused by atmospheric pollution of other parts after damaging the vacuum and a product formed by water vapor and residual hydrogen bromide gas. Moreover, recovery and verification time of the etching machine may be reduced after the vacuum is damaged, which may effectively improve the competitiveness of the equipment.

For another technical solution, embodiments of the present disclosure also provide a reaction chamber 20, the specific structure is shown in FIG. 1. The reaction chamber 20 includes the height-adjustment system 10 provided in any one embodiment.

For another technical solution, embodiments of the present disclosure also provide a semiconductor processing equipment, the specific structure is shown in FIG. 1. The semiconductor processing equipment includes a vacuum transfer system 60 (e.g., a transfer platform) and a reaction chamber 20 connected to the vacuum transfer system 60. A manipulator 61 is arranged in the vacuum transfer system 60. The semiconductor processing equipment may include various equipment such as an etching machine.

In summary, the technical solutions of the lift thimble system, the reaction chamber, and the semiconductor processing equipment provided by the above embodiments includes adding the focus ring thimble device to lift the focus ring from the initial position by ascending or return the focus ring to the initial position by descending, When the wafer thimble device lifts the wafer from the base, if the wafer has the position deviation and tilts, the focus ring can be raised to lift the wafer up. Thus, without damaging the vacuum of the reaction chamber, the adhesion problem of the wafer and the base may be solved to ensure that the manipulator may successfully take out the wafer. As such, the maintenance efficiency of the abnormal condition may be improved, and the risk of wafer scrap and maintenance cost may be reduced. In addition, the focus ring thimble device may be configured to precisely raise the height of the focus ring after the predetermined time, which may cause the service lifetime of the focus ring to be doubled. Moreover, the focus ring may be replaced without damaging the reaction vacuum to improve the efficiency of replacing consumable parts.

Unless otherwise stated, if any of the above-mentioned technical solutions disclosed in the present disclosure discloses a numerical range, then the disclosed numerical range is a preferred numerical range. Those skilled in the art should understand that the preferred numerical range only includes values that are obvious and representative for the technical effect among the many feasible values. Since a large number of numerical values cannot be exhaustively listed, the present disclosure discloses some numerical values to illustrate the technical solutions of the present disclosure. Moreover, the above-listed numerical values should not constitute a limitation on the scope of the present disclosure.

Meanwhile, if the present disclosure discloses or involves parts or structural parts that are fixedly connected to each other, unless otherwise stated, a fixed connection may be understood as a fixed connection that can be detached (e.g., bolt connection and screw connection). It can also be understood as a non-detachable fixed connection (e.g., riveting and welding). Of course, the mutual fixed connection may also be replaced by an integrated structure (e.g., manufactured integrally by a casting process) (except obviously the situation that the integrated forming process cannot be used).

In addition, unless otherwise stated, the terms in any of the technical solutions disclosed in the present disclosure used to indicate a positional relationship or shape may include a status or shape identical to, similar to, or close to the terms. Any component provided by the present disclosure may be assembled by a plurality of individual parts, or may include a single component manufactured by the integral forming process.

Above embodiments are only used to illustrate the technical solutions of the present disclosure and not to limit them. Although the present disclosure has been described in detail with reference to the preferred embodiments, those of ordinary skill in the art should understand that modifications may be performed on specific embodiments of the present disclosure, or equivalent replacements may be performed on some technical features. Without departing from the spirit of the technical solution of the present disclosure, all of the modifications and equivalent replacements shall still be within the scope of the technical solutions of the present disclosure.

The description of the present disclosure is intended to provide examples and description, and is not exhaustive or does not limit the present disclosure to the disclosed form. Many modifications and changes are obvious to those of ordinary skill in the art. Embodiments are selected and described in order to better illustrate the principle and practical applications of the present disclosure, and to enable those of ordinary skill in the art to understand the present disclosure. Thereby, those of ordinary skill in the art may design various embodiments with various modifications suitable for specific purposes.

What is claimed is:

1. A lift thimble system, comprising:
a focus ring;
an electrostatic chuck;
a wafer thimble device; and
a focus ring thimble device, wherein:
the focus ring is disposed at the electrostatic chuck for placing a wafer;
the focus ring thimble device and the wafer thimble device are located under the electrostatic chuck;
the focus ring thimble device includes at least three focus ring thimbles and a first lift drive device configured to drive the at least three focus ring thimbles to ascend or descend, thereby driving the focus ring to ascend or descend;
the wafer thimble device includes a wafer thimble and a second lift drive device configured to drive the wafer thimble to ascend or descend, thereby driving the wafer placed on the focus ring to ascend or descend;
the first lift drive device includes a drive bracket, a first drive unit, and at least three first bellows;
a bottom end of each focus ring thimble of the at least three focus ring thimbles is connected to the drive bracket, each focus ring thimble is disposed inside a first bellow of the at least three first bellows, and two ends of the first bellows are connected to an interface plate disposed under the electrostatic chuck and the drive bracket, respectively; and
the first drive unit includes:
a linear cylinder, a movable end of the linear cylinder fixedly connected to the drive bracket; a crank mechanism, swingable and fixedly connected to the interface plate, and further connected to the linear cylinder; and a swing cylinder, connected to the crank mechanism;
the crank mechanism is configured with an eccentric value,
the focus ring thimble device is configured to raise a height of the focus ring, a maximum value of the raised height equals to the eccentric value of the crank mechanism,
wherein
the focus ring includes an etched focus ring after an etching process on the wafer,
the swing cylinder is configured to push the crank mechanism to eccentrically swing a predetermined angle to cause a mechanism including the linear cylinder and the drive bracket to be lifted as a whole until the raised height of the etched focus ring equals to an etched height corresponding to an etched amount etched from an original form of the focus ring.

2. The lift thimble system according to claim 1, wherein:
the at least three focus ring thimbles are arranged at intervals along a circumferential direction of the drive bracket; and
the at least three focus ring thimbles are disposed corresponding to the at least three first bellows.

3. The lift thimble system according to claim 1, wherein the first drive unit further includes:
a throttle valve, a flow meter, wherein
the flow meter is configured to detect an actual airflow of the swing cylinder; and
the throttle valve is configured to adjust an airflow of the swing cylinder according to the actual airflow to control a swing angle of the swing cylinder.

4. A lift thimble system, comprising:
a focus ring;
an electrostatic chuck;
a focus ring thimble device; and
a wafer thimble device;
wherein:
the focus ring is disposed at the electrostatic chuck for placing a wafer;
the focus ring thimble device and the wafer thimble device are located below the electrostatic chuck;
the focus ring thimble device includes a focus ring thimble and a first lift drive device configured to drive the focus ring thimble to ascend or descend, thereby driving the focus ring to ascend or descend;
the wafer thimble device includes at least three wafer thimbles and a second lift drive device configured to drive the at least three wafer thimbles to ascend or descend, thereby driving the wafer placed on the focus ring to ascend or descend;
the second lift drive device includes a second drive unit including a cylinder, a barrel, and a second bellows;
two ends of the barrel are fixedly connected to a interface plate disposed under the electrostatic chuck and a cylinder body of the cylinder, respectively;
a movable end of the cylinder is fixedly connected to a bottom of the at least three wafer thimbles;
the second bellows is disposed inside the barrel and the wafer thimble is disposed inside the second bellows; and
the movable end of the cylinder drives the at least three wafer thimbles to ascend and descend, wherein
the first lift drive device includes a drive bracket, a first drive unit, and at least three first bellows;
a bottom end of each focus ring thimble of the at least three focus ring thimbles is connected to the drive bracket, each focus ring thimble is disposed inside a first bellow of the at least three first bellows, and two ends of the first bellow are connected to the interface plate and the drive bracket, respectively; and
the first drive unit includes:
a linear cylinder, a movable end of the linear cylinder fixedly connected to the drive bracket; a crank mechanism, swingable and fixedly connected to the interface plate, and further connected to the linear cylinder; and a swing cylinder, connected to the crank mechanism;
the crank mechanism is configured with an eccentric value,
the focus ring thimble device is configured to raise a height of the focus ring, a maximum value of the raised height equals to the eccentric value of the crank mechanism, wherein
the focus ring includes an etched focus ring after an etching process on the wafer,
the swing cylinder is configured to push the crank mechanism to eccentrically swing a predetermined angle to cause a mechanism including the linear cylinder and the drive bracket to be lifted as a whole until the raised height of the etched focus ring equals to an etched height corresponding to an etched amount etched from an original form of the focus ring.

5. The lift thimble system according to claim 4, wherein:
the at least three wafer thimbles are arranged at intervals along a circumferential direction of the electrostatic chuck; and
each of the at least three wafer thimbles is disposed corresponding to the second drive unit.

6. A vacuum reaction chamber, comprising a lift thimble system disposed at a base of an electrostatic chuck inside the vacuum reaction chamber, wherein the lift thimble system includes:
a focus ring;
an electrostatic chuck;
a wafer thimble device; and
a focus ring thimble device; wherein:
the focus ring is disposed at the electrostatic chuck for placing a wafer;
the focus ring thimble device and the wafer thimble device are located under the electrostatic chuck;
the focus ring thimble device includes at least three focus ring thimbles and a first lift drive device configured to drive the at least three focus ring thimbles to ascend or descend, thereby driving the focus ring to ascend or descend;
the wafer thimble device includes a wafer thimble and a second lift drive device configured to drive the wafer thimble to ascend or descend, thereby driving the wafer placed on the focus ring to ascend or descend;
the first lift drive device includes a drive bracket, a first drive unit, and at least three first bellows;
a bottom end of each focus ring thimble of the at least three focus ring thimbles is connected to the drive bracket, each focus ring thimble is disposed inside a first bellow of the at least three first bellows, and two ends of the first bellows are connected to an interface plate disposed under the electrostatic chuck and the drive bracket, respectively; and
the first drive unit includes:
a linear cylinder, a movable end of the linear cylinder fixedly connected to the drive bracket; a crank mechanism, swingable and fixedly connected to the interface plate, and further connected to the linear cylinder; and a swing cylinder, connected to the crank mechanism;
the crank mechanism is configured with an eccentric value,
the focus ring thimble device is configured to raise a height of the focus ring, a maximum value of the raised height equals to the eccentric value of the crank mechanism,
wherein
the focus ring includes an etched focus ring after an etching process on the wafer,
the swing cylinder is configured to push the crank mechanism to eccentrically swing a predetermined angle to cause a mechanism including the linear cylinder and the drive bracket to be lifted as a whole until the raised height of the etched focus ring equals to an etched height corresponding to an etched amount etched from an original form of the focus ring.

7. Semiconductor processing equipment, comprising a mechanical manipulator and the vacuum reaction chamber according to claim 6.

8. The vacuum reaction chamber according to claim 6, wherein:
the at least three focus ring thimbles are arranged at intervals along a circumferential direction of the drive bracket; and
the at least three focus ring thimbles are disposed corresponding to the at least three first bellows.

9. The vacuum reaction chamber according to claim 6, wherein the first drive unit further includes:
a throttle valve, a flow meter, wherein
the flow meter is configured to detect an actual airflow of the swing cylinder; and
the throttle valve is configured to adjust an airflow of the swing cylinder according to the actual airflow to control a swing angle of the swing cylinder.

10. A vacuum reaction chamber, comprising the lift thimble system according to claim 4, disposed at the base of the electrostatic chuck inside the vacuum reaction chamber.

11. The vacuum reaction chamber according to claim 10, wherein:
the at least three wafer thimbles are arranged at intervals along a circumferential direction of the electrostatic chuck; and
each of the at least three wafer thimbles is disposed corresponding to the second drive unit.

12. Semiconductor processing equipment, comprising a mechanical manipulator and the vacuum reaction chamber according to claim 10.

* * * * *